United States Patent
Drew et al.

(10) Patent No.: US 6,393,102 B1
(45) Date of Patent: May 21, 2002

(54) COMPUTER-EXECUTABLE METHOD FOR DIAGNOSING TROUBLE CAUSES IN TELEPHONE CABLE SEGMENTS WHEN TROUBLE DATA ARE AVAILABLE ONLY FOR ENTIRE CABLES

(75) Inventors: James Howard Drew, Boxborough; Andrew Louis Betz, III, Pepperell, both of MA (US)

(73) Assignee: Verizon Laboratories Inc., Waltham, MA (US)

( * ) Notice: Subject to any disclaimer, the term of this patent is extended or adjusted under 35 U.S.C. 154(b) by 0 days.

(21) Appl. No.: 09/317,288

(22) Filed: May 24, 1999

(51) Int. Cl.[7] .......................... H04M 1/24; H04M 3/08; H04M 3/22
(52) U.S. Cl. ..................... 379/25; 379/22.07; 379/30; 324/539
(58) Field of Search .............................. 379/1.01, 1.04, 379/22.01, 22.02, 22.03, 22.07, 25, 30, 32.02, 14.01; 324/500, 519–522, 534–535, 538–539, 543

(56) References Cited

U.S. PATENT DOCUMENTS

| | | | |
|---|---|---|---|
| 4,611,099 A | * | 9/1986 | Ray et al. |
| 4,901,004 A | * | 2/1990 | King |
| 4,975,938 A | * | 12/1990 | Hayes |
| 5,166,970 A | * | 11/1992 | Ward |
| 5,764,725 A | * | 6/1998 | Martin, Jr. et al. |

OTHER PUBLICATIONS

Barlow, "Statistical Theory of Reliability and Life Testing" Silver Spring Pub., Silver Spring, MD; pp. 1–28 (1981).

Norusis, M. "SPSS for Windows Advanced Statistics Release 6.0", SPSS Pub., Chicago, IL; pp. 216–232 (1993).

* cited by examiner

Primary Examiner—Duc Nguyen
(74) Attorney, Agent, or Firm—Leonard Charles Suchyta; James K. Weixel (57) ABSTRACT

A computer-executable method for diagnosing trouble causes in telephone cable segments when trouble data are available only for entire cables is presented. This method diagnoses problems in the components of processes when the component location of process problems is not known. It gives a statistical relationship between component attributes and process problem rates, to facilitate assessment and improvement of policies about the process. This method may be used for diagnosing systematic problems in segments of telephone cable connections of given central offices.

15 Claims, 7 Drawing Sheets

> TYPE IN A 1(0) IF CABLE CONNECTION I HAS (HAS NOT HAD) CABLE TROUBLE,
"A 1(0)" IF THE FIRST CABLE CONNECTION EMANATES (DOES NOT EMANATE) FROM CENTRAL OFFICE #,
THE NUMBER OF CABLE COMPONENTS OF TYPE CTyp1 IN CABLE CONNECTION 1,
THE SUM OF AGES OF CTyp1 COMPONENTS IN CABLE CONNECTION 1,
THE NUMBER OF CABLE COMPONENTS OF TYPE CTyp2 IN CABLE CONNECTION 1,
THE SUM OF AGES OF CTyp2 COMPONENTS IN CABLE CONNECTION 1,
THE NUMBER OF CABLE COMPONENTS OF TYPE CTyp3 IN CABLE CONNECTION 1,
THE SUM OF AGES OF CTyp3 COMPONENTS IN CABLE CONNECTION 1;
(SEPARATE EACH NUMBER BY A COMMA AND FINISH WITH A CARRIAGE RETURN)

> 1 , 3 , 7 , 4 , 6 , 2 , 10

> TYPE IN A 1(0) IF THE SECOND CABLE CONNECTION EMANATES (DOES NOT EMANATE) FROM CENTRAL OFFICE #, THE NUMBER OF CABLE COMPONENTS OF TYPE CTyp1 IN CABLE CONNECTION 2,
...
> 3.2 , 2.1 , 6.5 , 2.6 , 1.2 , 0.7 , 0.3

| | 501 cabtrbl | 502 co1 | 503 n_ctyp1 | 504 agectyp1 | 505 n_ctyp2 | 506 agectyp2 | 507 n_ctyp3 | 508 |
|---|---|---|---|---|---|---|---|---|
| 1 | .00 | 1.00 | 8.00 | 169.00 | 2.00 | 21.00 | 1.00 | |
| 2 | .00 | .00 | 8.00 | 169.00 | 6.00 | 64.00 | 1.00 | |
| 3 | 1.00 | 1.00 | 14.00 | 273.00 | 5.00 | 40.00 | 3.00 | |
| 4 | .00 | .00 | 11.00 | 223.00 | 9.00 | 73.00 | .00 | |
| 5 | .00 | 1.00 | 16.00 | 451.00 | 10.00 | 100.00 | .00 | |
| 6 | .00 | 1.00 | 14.00 | 409.00 | 16.00 | 154.00 | .00 | |
| 7 | .00 | 1.00 | 14.00 | 409.00 | 3.00 | 23.00 | .00 | |
| 8 | 1.00 | .00 | 14.00 | 409.00 | 15.00 | 75.00 | .00 | |
| 9 | .00 | 1.00 | 14.00 | 409.00 | 2.00 | 18.00 | .00 | |
| 10 | .00 | .00 | 7.00 | 229.00 | .00 | .00 | .00 | |
| 11 | .00 | 1.00 | 7.00 | 229.00 | 1.00 | 8.00 | 1.00 | |
| 12 | .00 | 1.00 | 7.00 | 229.00 | 20.00 | 150.00 | .00 | |
| 13 | .00 | .00 | 7.00 | 229.00 | 4.00 | 32.00 | .00 | |
| 14 | .00 | .00 | 11.00 | 355.00 | 2.00 | 16.00 | 2.00 | |
| 15 | .00 | .00 | 11.00 | 355.00 | 14.00 | 102.00 | .00 | |
| 16 | .00 | .00 | 11.00 | 355.00 | 10.00 | 78.00 | .00 | |
| 17 | .00 | 1.00 | 3.00 | 54.00 | 9.00 | 68.00 | .00 | |
| 18 | .00 | .00 | 3.00 | 54.00 | 5.00 | 45.00 | 4.00 | |
| 19 | .00 | 1.00 | .00 | .00 | 3.00 | 21.00 | 2.00 | |
| 20 | .00 | 1.00 | 3.00 | 54.00 | .00 | .00 | .00 | |
| 21 | .00 | 1.00 | 3.00 | 54.00 | .00 | .00 | .00 | |
| 22 | .00 | .00 | 3.00 | 54.00 | .00 | .00 | 2.00 | |
| 23 | .00 | .00 | 3.00 | 54.00 | 2.00 | 10.00 | 1.00 | |
| 24 | .00 | 1.00 | 3.00 | 85.00 | 1.00 | 13.00 | 1.00 | |
| 25 | .00 | .00 | 3.00 | 85.00 | 5.00 | 60.00 | 1.00 | |
| 26 | .00 | 1.00 | 3.00 | 85.00 | .00 | .00 | .00 | |
| 27 | .00 | 1.00 | 3.00 | 85.00 | 4.00 | 32.00 | .00 | |
| 28 | .00 | 1.00 | 2.00 | 49.00 | 19.00 | 172.00 | .00 | |

FIG. 6

COMPUTER-EXECUTABLE METHOD FOR DIAGNOSING TROUBLE CAUSES IN TELEPHONE CABLE SEGMENTS WHEN TROUBLE DATA ARE AVAILABLE ONLY FOR ENTIRE CABLES

BACKGROUND OF THE INVENTION

1. Field of the Invention

This application relates to use of a computer system for trouble diagnosis and performance forecasting, and more particularly to techniques executed in a computer system for performance fitting, diagnosing, and forecasting of telephone connections based on curve fitting of data points involving telephone cable characteristics.

2. Description of Related Art

Numerous types of procedures involve many steps which are associated with particular components of the procedures. Each component in turn may have particular characteristics which, along with other factors, dictate the performance of each component. Having information related to component performances is advantageous for making diagnoses of trouble, minimizing costs, making repairs, and suggesting new, more efficient alternatives. Sometimes, however, knowing the performance of each component is neither easy nor even desirable, even if all the performances could be known, because this amount of information would be too unwieldy. Instead, the performances of the components of a realization may be mapped to an overall performance of the realization. The overall performance gives an indication of the global success of the procedure.

A telephone cable connection, as well as other multi-component processes, is an example where performance or trouble incidence is generally recorded for the entire connection, rather than the individual components. Common analysis of trouble involves an aggregate categorization of trouble type for each connection. However, because, in general, each connection may have a different configuration, these common approaches to trouble analysis preclude a diagnosis of its components. Thus, an intuitive and anecdotal examination of these aggregate trouble frequencies are sometimes used to subjectively assess component repair and replacement policies.

More objective approaches, such as the classical technique of using logistic regression to model cable trouble rates, do exist. However, although superficially relating holistic cable trouble and aggregate segment characteristics, these approaches do not account for the probabilistic structure relating cable trouble to component trouble, and do not allow an appropriate mathematical form for component trouble.

These traditional aggregate techniques do not objectively inform managers of the effects of their policies and tactics for individual components. The characteristics of the components cannot be related to trouble types and rates. The logistic regression solution does not appropriately exploit the relationship in trouble probabilities among the cable components. Although these techniques might be augmented by using more sophisticated nonlinear regression analysis, the high data storage and computational power requirements may be prohibitive.

SUMMARY OF THE INVENTION

According to the present invention, statistical relationships between aggregate troubles and process (e.g., cable) components are constructed in a manner that facilitates the fitting of the overall performance to field data with a relatively small number of free parameters. Such fitting can aid in the diagnosing and forecasting of performance problems that can be used to make policy decisions pertaining to what apparatus and technology to use. These decisions may then be evaluated by proper benchmarking of the apparatus. The present method has sufficiently low data storage and computational demands to permit its implementation on virtually any microcomputer.

These desirable attributes of the present method are achieved by a judicious choice of a trial function, which relates component characteristics and component performances, to be used for data fitting. A good choice for such a function would lead to a number of useful functions of the characteristics instead of all the characteristics themselves. Because the number of such functions of the characteristics is considerably less than the total number of characteristics across a connection, a reduction in the data required to perform the curve fitting may be possible.

Specifically, a method executed in a computer system for diagnosing, and predicting trouble causes in a process involving realizations of performance is presented. The ith realization has $n_i$ steps and the performance is a function of a c-component vector of characteristics, the performance and vector having a value of $\theta_i[j, x_i(j)]$ and $x_i(j)$, respectively, at the jth step of the ith realization. (The component of a vector should not be confused with the component of a connection; the former refers to each of the numbers in an ordered set defining a column or row vector, the latter is associated with each of the $n_i$ steps of connection i.) The method comprises a) expressing an overall performance, $\psi_i$, as a function, $\phi_i$, of the performance at each of the $n_i$ steps, $\psi_i = \phi_i\{\theta_i[1, x_i(1)], \theta_i[2, x_i(2)], \ldots, \theta_i[n_i, x_i(n_i)]\}$; b) choosing a function, f, of a d-component vector of parameters, $\beta$, and the c-component vector of characteristics with which to approximate the performances, $\theta_i[j, x_i(j)] \approx f[\beta, x_i(j)]$. The function f is chosen such that the overall performance, $\psi_i$, can be written as a function, $\gamma_i$, of the d-component vector of parameters and r c-component vectors, $s_{i,1}, s_{i,2}, \ldots,$ and $s_{i,r}$, that depend on the $n_i$ characteristic vectors $x_i(1), x_i(2), \ldots,$ and $x_i(n_i)$, $$\psi_i = \phi_i\{f[\beta, x_i(1)], f[\beta, x_i(2)], \ldots, f[\beta, x_i(n_i)]\}$$
$$\equiv \gamma_i\{\beta, s_{i,1}[x_i(1), x_i(2), \ldots, x_i(n_i)],$$
$$s_{i,2}[x_i(1), x_i(2), \ldots, x_i(n_i)], \ldots,$$
$$s_{i,r}[x_i(1), x_i(2), \ldots, x_i(n_i)]\}$$

where $r < n_i$; c) finding a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots,$ and $s_{i,r}$.

In a specific embodiment, the method further comprises predicting the overall performance of a realization from r c-component vectors that correspond to $s_{i,1}, s_{i,2}, \ldots,$ and $s_{i,r}$ by utilizing the best vector of parameters.

In another embodiment, the step of choosing a function, f, of a d-component vector of parameters, $\beta$, and the c-component vector of characteristics, includes choosing a function, f, of a c-component vector of parameters, $\beta$, and the c-component vector of characteristics.

In a specific embodiment, the method includes expressing the overall performance, $\psi_i$, as $\psi_i = \theta_i[1, x_i(1)]\theta_i[2, x_i(2)] \ldots \theta_i[n_i, x_i(n_i)]$, and choosing the function $f = \exp[\beta \cdot x_i(j)]$, where $\beta \cdot x_i(j)$ denotes an inner product of $\beta$ and $x_i(j)$.

In an embodiment of the invention, fitting the function $\gamma_i(\beta, s_{i,1}, s_{i,2}, \ldots, s_{i,r})$ proceeds by utilizing a microprocessor, and a regression algorithm, which may employ the Levenberg-Marquardt method, to estimate the vector of parameters, $\beta$, that approximately maximizes agreement between the function $\gamma_i(\beta, s_{i,1}, s_{i,2}, \ldots s_{i,r})$ and the data points. The Levenberg-Marquardt method may utilize a figure-of-merit function that measures this agreement.

In an other embodiment of the present invention, a method executed in a computer system for predicting trouble in a telephone connection is presented comprising a) characterizing a jth component of a sequence of $n_i$ components of an ith telephone connection by a c-component vector of characteristics $x_i(j)$; b) assigning a performance $\theta_i[j, x_i(j)]$ to the jth component of the ith telephone connection; c) approximating the performance as $\theta_i[j, x_i(j)] = \exp[\beta \cdot x_i(j)]$, where $\beta$ is a c-component vector of parameters and $\beta \cdot x_i(j)$ denotes an inner product of $\beta$ and $x_i(j)$; d) defining an overall performance of the ith telephone connection as the product of the performances over the components of the ith realization, $$\psi_i = \prod_{j=1}^{ni} \theta_i[j, x_i(j)];$$

e) varying the vector of parameters $\beta$ to find a best vector of parameters that fits a curve $$\psi_i = \exp\left[\beta \cdot \sum_{j=1}^{ni} x_i(j)\right]$$
$$= \exp(\beta \cdot s_i),$$

where $s_i = x_i(1) + x_i(2) + \ldots + x_i(n_i)$, through data points corresponding to the overall performance versus $s_i$.

In another embodiment, this last method further comprises predicting the overall performance of a realization from a c-component vector, that corresponds to $s_i$, by utilizing the best vector of parameters.

Also presented is a system for diagnosing, and predicting trouble causes in a process involving realizations of performance. The ith realization has $n_i$ steps and the performance is a function of a c-component vector of characteristics. The performance and c-component vector have a value of $\theta_i[j, x_i(j)]$ and $x_i(j)$, respectively, at the jth step of the ith realization, comprising a) a computer; b) instructions for the computer to express an overall performance, $\psi_i$, as a function, $\phi_i$, of the performance at each of the $n_i$ steps, $\psi_i = \phi_i\{\theta_i[1, x_i(1)], \theta_i[2, x_i(2)], \ldots \theta_i[n_i, x_i(n_i)]\}$; c) instructions for the computer to choose a function, f, of a d-component vector of parameters, $\beta$, and the c-component vector of characteristics with which to approximate the performances, $\theta_i[j, x_i(j)] \approx f[\beta, x_i(j)]$, such that the overall performance, $\psi_i$, can be written as a function, $\gamma_i$, of the d-component vector of parameters and r c-component vectors, $s_{i,1}, s_{i,2}, \ldots,$ and $s_{i,r}$, that depend on the $n_i$ characteristic vectors $x_i(1), x_i(2), \ldots,$ and $x_i(n_i)$, $$\psi_i = \phi_i\{f[\beta, x_i(1)], f[\beta, x_i(2)], \ldots, f[\beta, x_i(n_i)]\}$$
$$\equiv \gamma_i\{\beta, s_{i,1}[x_i(1), x_i(2), \ldots, x_i(n_i)],$$
$$s_{i,2}[x_i(1), x_i(2), \ldots, x_i(n_i)], \ldots,$$
$$s_{i,r}[x_i(1), x_i(2), \ldots, x_i(n_i)]\}$$

where $r < n_i$; and d) instructions for the computer to find a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots,$ and $s_{i,r}$.

In another embodiment, in the previous system for diagnosing, and predicting trouble causes, an overall performance of a process with given characteristics is forecast by using the function $\gamma_i(\beta, s_{i,1}, s_{i,2}, \ldots, s_{i,r})$ with the best vector of parameters.

In yet another embodiment, a system is presented for predicting trouble in a telephone connection. A jth component of a sequence of $n_i$ components of an ith telephone connection is characterized by a c-component vector of characteristics $x_i(j)$. The system comprises a) a computer; b) instructions to the computer to assign a performance $\theta_i[j, x_i(j)]$, that depends on the vector of characteristics, to the jth component of the ith telephone connection; c) instructions to the computer to (i) approximate the performance as $\theta_i[j, x_i(j)] = \exp[\beta \cdot x_i(j)]$, where $\beta$ is a c-component vector of parameters and $\beta \cdot x_i(j)$ denotes an inner product of $\beta$ and $x_i(j)$, and (ii) define an overall performance of the ith telephone connection as the product of the performances over the components of the ith realization, $$\psi_i = \prod_{j=1}^{ni} \theta_i[j, x_i(j)]; \text{ and}$$

e) means for varying the vector of parameters $\beta$ to find a best vector of parameters to fit a curve $$\psi_i = \exp\left[\beta \cdot \sum_{j=1}^{ni} x_i(j)\right]$$
$$= \exp(\beta \cdot s_i),$$

where $s_i = x_i(1) + x_i(2) + \ldots + x_i(n_i)$, to data points corresponding to the overall performance versus $s_i$.

In another embodiment, a system to diagnose trouble causes in telephone cable segments when trouble data are available only for entire cables is presented. The system includes a computer; means for approximating an overall performance of a telephone connection depending on n c-component vectors of characteristics so that the overall performance can be modeled by using a function with adjustable c-component vectors of parameters, the vectors of parameters being less in number than n; and means for varying the adjustable c-component vectors of parameters to find best-fit vectors of parameters to fit a curve to data points. The means for varying the adjustable c-component vectors of parameters can include using a regression algorithm. The diagnosis proceeds by examining and interpreting the vector of parameters $\beta$.

DETAILED DESCRIPTION OF THE PREFERRED EMBODIMENT

Procedures that satisfy particular business needs may include a sequence of steps. Each step is associated with a particular component of the procedure. For example, a service order may include a sequence of departmental interventions in a company, and a land line telephone connection may include a sequence of cables that are electrically connected to establish telephone service to a home. With each component of the procedure is associated a performance. The performance, however, may depend on a countless number of factors, some of which are unknown. It is no surprise, then, that the jth step of any two invocations or realizations of the procedure may have different performances even if the two realizations involve the same components. A telephone call to a person, for example, may be accompanied by electrical noise even if moments earlier a telephone call to the same person over the same telephone lines was successful. A fortiori, if different components are involved in the two realizations—in the previous example, this would be the case if two persons at different households were called—then the performance of the jth step may generally be different.

These types of procedures may be treated as a stochastic process. In particular, the performance, denoted by $\theta(j)$, could be considered to be a random variable that is a function of the step j. The total number of steps $n_i$ of the ith realization can, in principle, be arbitrarily large, and be different from other realizations. In the example of a telephone connection, two realizations of a call from location A to location B may be obtained either by making two telephone calls using the same connection or by making two telephone calls using different connections. In the latter case, the number of steps or components to complete the two calls may be different. Moreover, two realizations may start out at A, but end up at different locations, B and C. Again, these two realizations may have a different number of total steps. The performance, if directly measurable at all, may be determined probabilistically. That is, it may be assumed that there is a probability density, p, with the property that $p[\theta(1), \theta(2), \ldots, \theta(n_i)]d\theta(1)\, d\theta(2) \ldots d\theta(n_i)$ is the probability that the performance takes on a value between $\theta(1)$ and $\theta(1)+d\theta(1)$ at step 1, $\theta(2)$ and $\theta(2)+d\theta(2)$ at step 2, . . . , and $\theta(n_i)$ and $\theta(n_i)+d\theta(n_i)$ at step $n_i$. Sometimes the performances are a function of a non-random, c-component vector of characteristics, $x_i(j)$, that is a function of the step j. The functional form of these characteristics is also assumed to depend on the realization, hence the subscript i. In the example of telephone connections, the relevant characteristics might include the age of the telephone cables involved in the connection, as well as the type, length, size, and gauge of the cables.

Sometimes, it is not the actual realizations that are of concern, but rather some function of the realizations. An example of such a function is the overall performance: designating the ith realization of the performance by $\theta_i[j, x_i(j)]$, the overall performance of the ith realization may be denoted by $$\psi_i = \phi_i\{\theta_i[1, x_i(j)], \theta_i[2, x_i(j)], \ldots, \theta_i[n_i, x_i(j)]\}, \quad (1)$$

for some appropriate function $\phi_i$. The overall performance maps the sequence $\{\theta_i[1, x_i(j)], \theta_i[2, x_i(j)], \ldots, \theta_i[n_i, x_i(j)]\}$ for a particular realization i to a number $\phi_i\{\theta_i[1, x_i(j)], \theta_i[2, x_i(j)], \ldots, \theta_i[n_i, x_i(j)]\}$, which attempts to capture, in a global sense, how well the various components are functioning. A simple example of an overall performance would be the average of the performances over the number of steps, $n_i$, in a realization.

An actual realization may be a complicated function of the step j. Sometimes it might be useful to try to fit a curve through each of the realizations. This, however, is sometimes difficult because too many parameters would be needed for the curve fit, and, moreover, the performances, $\theta_i$, may not even be known. Instead of attempting to fit the performances, $\theta_i$, it may be more profitable to first approximate the $\theta_i$ using a trial function, f, having some free parameters. The type of trial function chosen is one that reduces the number of these free parameters needed to perform the curve fit. The overall performance may then be obtained using this approximation for the performances. Finally this expression for the overall performance may be fitted to performance-characteristic data by varying the free parameters.

A trial function f is chosen that reduces the number of free parameters needed for the curve fit. The fit can proceed by choosing a function f of a d-component vector of parameters $\beta$, and the c-component vector of characteristics, with which to approximate the performances, $$\theta_i[j, x_i(j)] \approx f[\beta, x_i(j)]. \quad (2)$$

The trial function may be chosen so that the overall performance, $\psi$, can be written as a function, $\gamma_i$, of the d-component vector of parameters, $\beta$, and r c-component vectors, $s_{i,1}, s_{i,2}, \ldots,$ and $s_{i,r}$, that depend on the $n_i$ characteristic vectors $x_i(1), x_i(2), \ldots,$ and $x_i(n_i)$. In mathematical symbols, $$\psi_i = \phi_i\{f[\beta, x_i(1)], f[\beta, x_i(2)], \ldots, f[\beta, x_i(n_i)]\} \quad (3)$$

$$\equiv \gamma_i\{\beta, s_{i,1}[x_i(1), x_i(2), \ldots, x_i(n_i)], \quad (4)$$
$$s_{i,2}[x_i(1), x_i(2), \ldots, x_i(n_i)], \ldots,$$
$$s_{i,r}[x_i(1), x_i(2), \ldots, x_i(n_i)]\}$$

where $r<n_i$. From this last equation, it follows that $\psi_i$ may be expressed as a function of r independent vectors $s_{i,1}, s_{i,2}, \ldots,$ and $s_{i,r}$ instead of the $n_i$ vectors $x_i(1), x_i(2), \ldots$ and $x_i(n_i)$. Since $r<n_i$, one would expect that the number of parameters needed to fit the overall performance would be reduced.

Given data points of $s_i$ versus overall performance, it is possible to fit the curve $\gamma_i$ through these points by varying the parameters $\beta$. A regression algorithm, as may be found in commercial software packages, can find the best vector of parameters that provides a best fit. With these best vector of parameters in hand, it is possible to diagnose and predict the overall performance given r c-component vectors that correspond to $s_{i,1}, s_{i,2}, \ldots,$ and $s_{i,r}$.

In the application discussed below, for example, the performance $\psi_i$ is the probability of correct functioning of a telephone cable connection i composed of many cable components connected in series. Then if $\theta_i[j, x_i(j)]$ is the probability of the correct functioning of component j of connection i, it follows from the series connection of the components that $$\psi_i = \prod_{j=1}^{nj} \theta_i[j, x_i(j)] \qquad (5)$$

To ultimately estimate the overall performances, it is then convenient to choose $$\theta_i[j, x_i(j)] \approx f[\beta; x_i(j)] \qquad (6)$$

$$= \exp[\beta \cdot x_i(j)], \qquad (7)$$

where $\beta \cdot x_i(j)$ denotes the inner product of $\beta$ and $x_i(j)$, and it was assumed that the vectors $\beta$, and $x_i$ belong to vector spaces of the same dimension, i.e., c=d. Note, however, that in general d may be larger than c if interactions are included. In addition, the choice of the function f implies that the j dependence of the performance enters through $x_i(j)$, although in general the performance can also explicitly depend on the step j.

To estimate the overall performance, $\psi_i$, Eq. (.7) may be substituted into Eq. (5) to yield $$\psi_i = \prod_{j=1}^{ni} \exp[\beta \cdot x_i(j)] \qquad (8)$$

$$= \exp\left[\beta \cdot \sum_{j=1}^{ni} x_i(j)\right] \qquad (9)$$

$$= \exp(\beta \cdot s_i), \qquad (10)$$

where the c-component vector $s_i$ is defined by $$s_i = \sum_{j=1}^{ni} x_i(j). \qquad (11)$$

Using Eq. (10), it may be concluded that it is not necessary to know the individual characteristics at each step. Instead, it is the sum of the characteristics, $s_i$, that enter the computation. (In this example, r of Equation (4) is thus equal to one.) This is a valuable feature of the present formulation which also permits a reduction in the number of parameters needed to fit the overall performance. Being able to straightforwardly choose the parameters $\beta$ to achieve a good curve fit, with a standard statistical regression software package, is another advantage of this formulation of the process diagnosis problem. Still another is that a data set of summarized characteristics can often be used as inputs to the statistical routines, which may be an important feature in situations where the number of components $n_i$ is large.

The reliability of a telephone connection from a residence to a local telephone company's central office may perhaps be the central quality determinant for a public switched telephone network. Each of these connections consists of a varying number of components (cables) which can be one of a handful of types (e.g., air-core or gelatin-filled), three basic placement options (aerial, buried or underground conduit), and a wide variety of sizes and lengths. For any given residence, company databases may indicate the characteristics of the cable components which constitute that connection. Generally though, connection troubles are recorded and often defined only for connections as a whole, and not for a particular component.

For cable trouble diagnosis, Eq. (10) permits considerable data and parameter reduction. Instead of requiring each of 5–10 characteristics for each of 20–100 components per cable, for example, our model requires only the total number of cable components of a particular type across the entire cable, and (for diagnosing the effect of component age) the sum of the ages of components across the entire cable. Also, instead of requiring a set of parameters for each cable component, it is sufficient to estimate parameters only for the set of cable types and for age within type. (The exact number of parameters depends, as in most statistical regression model fitting, on the exact form of the postulated model. The number of parameters will, generally be much smaller than the number of components per line.)

When company management wishes to evaluate policy regarding the engineering, installation and preemptive replacement practices for these cables, it becomes vital to be able to make general statistical statements about the effect of cable characteristics on trouble frequency, even though no direct information is available. A cable characteristic that may be important is its age (i.e., the number of years since its installation), for its effect is dynamic and inevitable. Although other cable characteristics, such as gauge and size, have an effect on trouble rates, it is therefore helpful to fix our attention on the effect of cable age on the many types and placements of cable.

This can be understood as a process diagnosis problem in the following way. The process is a central office's provision of working local telephone connections over a particular time period, say one year. The realizations of that process are the individual connections to the residences associated with that central office. Note that the realizations, then, are arranged spatially rather than time-wise. Each component of a particular realization is a piece of cable, each of whose characteristics (type, placement, age, length, gauge, etc.) is known. A measure of related to the overall performance is the probability of cable-related trouble, Pr(CableTrouble) on each connection in the 12-month window. For connection i and components, one may define the overall performance as $$\psi_i = 1 - Pr(CableTrouble) \qquad (12)$$

$$= \prod_{j=1}^{ni} \theta_i[j, x_i(j)] \qquad (13)$$

where $\theta_i[j, x_i(j)]$ is the probability of no cable trouble in component j of connection i. This follows as the cable segments are always arranged in a series structure. The entire connection can be trouble-free if and only if each of its components is trouble-free during the time-window in question.

Quality improvement for cable maintenance requires the examination of such systematic policies as choice of cable type, ongoing cable upgrade programs, training, cable installation practice and the anticipation of the effects of increasing cable age. Many such company issues can be diagnosed by relating the probability of a problem in component j of cable i to such characteristics as cable type, age, gauge and size, as well as to its maintaining central office (and its idiosyncratic practices). Thus, for the diagnosis of trouble causes in telephone cable segments $$\theta_i[j, x_i(j)] = \exp[\beta_{CO} CO_i(j) + \beta_{Ctype} CType_i(j) + \beta_{Age} Age_i(j) + \{Other\ Charateristics_i(j)\}] \qquad (14)$$

where $CO_i(j)$ is the Central Office maintaining component j of the ith connection, $CType_i(j)$ is the Cable Type of component j of the ith connection, $Age_i(j)$ is the age of component j of the ith connection, and {OtherCharacteristics$_i$(j)} include length, size and gauge of component j, all for the ith connection.

This formulation uses a statistical decomposition of overall cable trouble rates to specify characteristics which are trouble causes. It exploits the great size and variety of cables in company databases to differentiate among alternative trouble causes. The resulting statistical (i.e., not location-specific) identifiers of trouble root causes are well suited to managerial decision-making.

The above description will now be illustrated by reference to the accompanying drawings. Referring to FIG. 1, a computer system 10 may be used to implement the present invention. In a preferred embodiment, the computer system 10 may include a Gateway 2000 computer, model P5–90, with a 90 MHz clock speed, 32 MB of RAM, and a 100 MB hard drive. The system 10 may be used to condense and summarize performance data of multi-component procedures, such as telephone connections, by fitting the data to a model that depends on adjustable parameters. Although the computer system 10 is shown for the purpose of illustrating a preferred embodiment, the present invention is not limited to the particular computer system 10 shown, but may be used on any electronic processing system having sufficient performance and characteristics (such as memory) to provide the functionality described herein.

The computer system 10 may include a microprocessor-based unit 11 for receiving and processing software programs and for performing other processing functions. A keyboard 12 may be connected to the microprocessor-based unit 11 for permitting a user to input information to the software. As an alternative to using the keyboard 12 for input, a mouse 13 may be used for moving a selector 14 on a display 15 and for selecting an item on which the selector 14 overlays, as is well known in the art. A floppy disk 16 may also include a software program, and is inserted into the microprocessor-based unit 11 for inputting the software program. Still further, the microprocessor-based unit 11 may be programmed, as is well known in the art, for storing the software program internally. A printer 17 may be connected to the microprocessor-based unit 11 for printing a hard copy of the output of the computer system 10.

The software used to implement the present invention, which can be written in a high-level language like C, Fortran, or Pascal, may be stored on a hard drive (not shown) located within the microprocessor-based unit 11. The software should be capable of interfacing with any internal or external subroutines, such as regression packages used to perform curve fitting. In one preferred embodiment, the SSPS statistical package (see below) may be used to perform regression analysis. In a preferred embodiment, the memory size of the computer system 10 is large enough to accommodate regression analysis software and to hold the relevant field data. In one preferred embodiment, approximately 2–3 MB of telephone cable field data, stored on a floppy disk 16 or a hard drive, may be used. For smaller amounts of field data, the software may use the display 15 to prompt the user to input relevant field data.

Figure 1A:
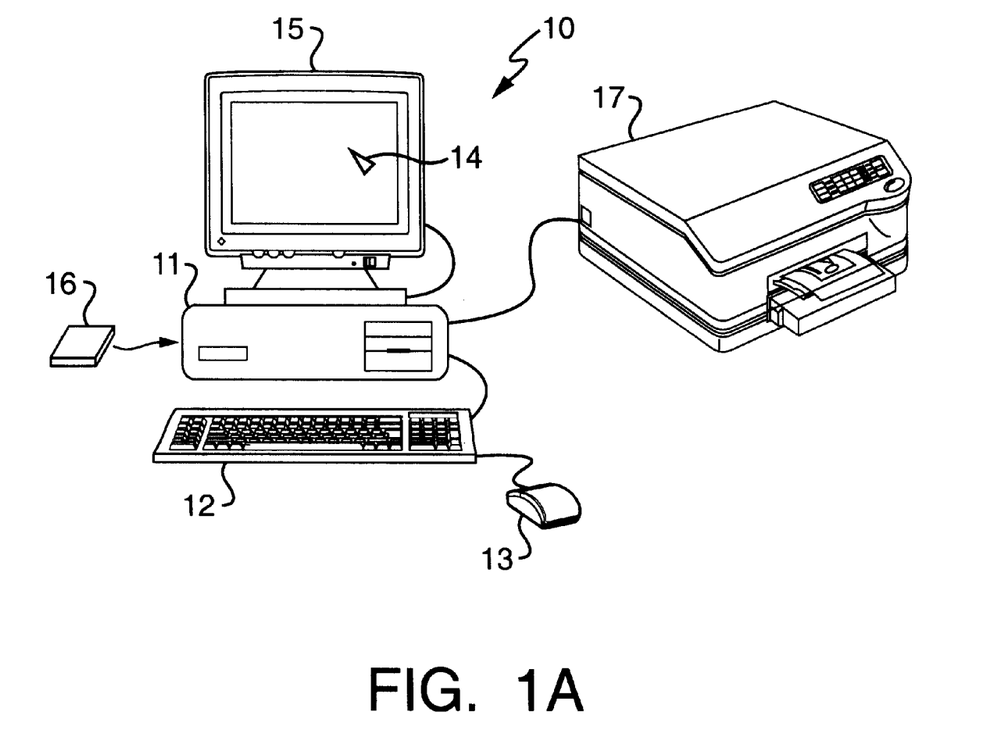
FIG. 1a is a perspective view of a computer system for implementing the present invention.
Figure 1B:
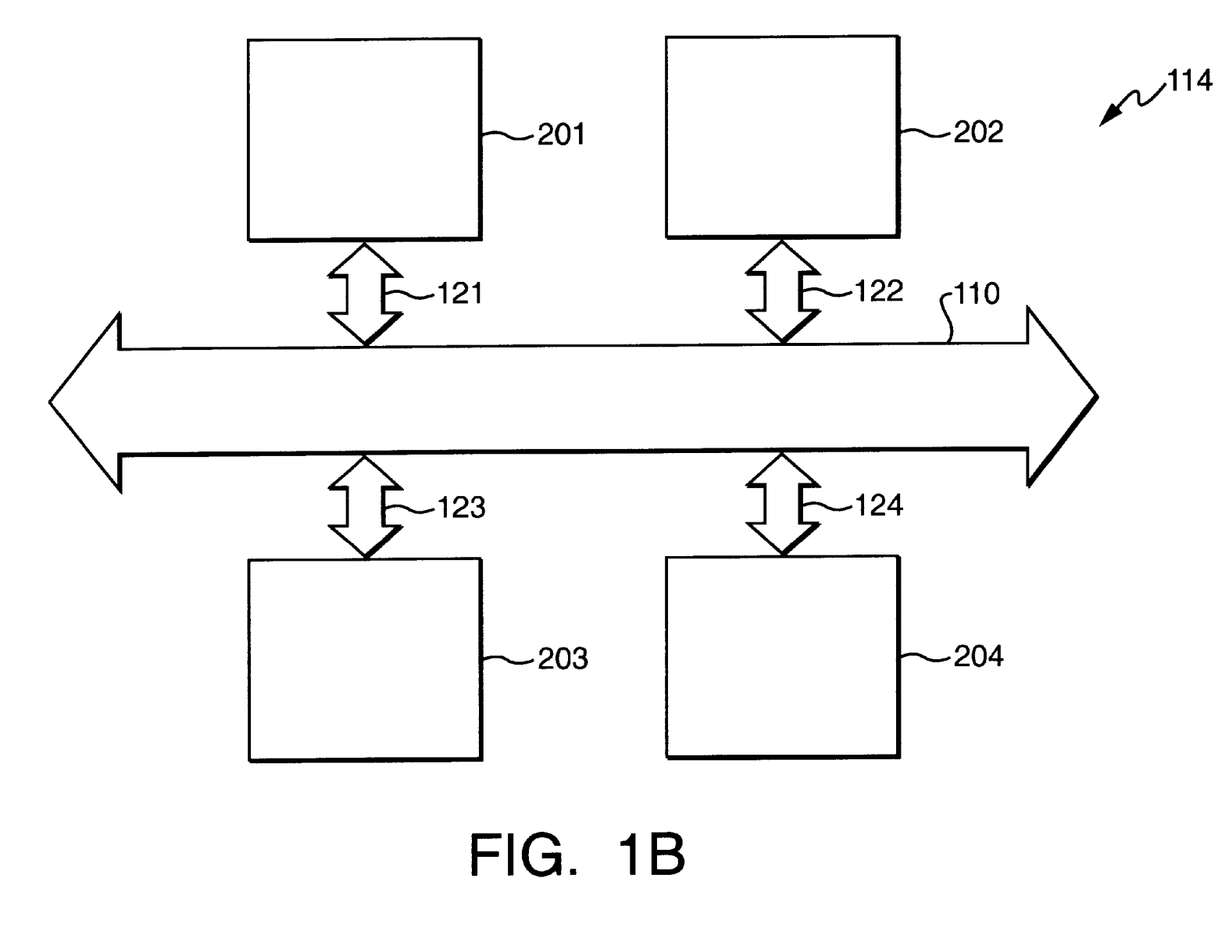
FIG. 1b is an example of a computer network used to process code pertaining to the present invention.

In other embodiments, the microprocessor used to process computer code pertaining to the present invention can be part of a network. For example, FIG. 1b illustrates a network computer system 114. The computer system 114 is shown to include a plurality of computer processors or nodes (201–204); connected to a network 110 by network interface connections 121–124, respectively. Particular nodes, such as the nodes 201, 202, may communicate using the network 110 over network connections 121, 122, respectively. The nodes 203, 204 similarly may communicate with other nodes using the network 110 through respective network interface connections 123, 124, respectively.

It should be noted that the hardware of the various nodes and network that may be included may vary with application and use. A conventional computer system, as well as a special manufactured computer system for a particular application, may be used in a preferred embodiment of the invention. Similarly an embodiment may include any type of network 110 required for a particular application. A preferred embodiment of the invention may include no network but may also reside on a standalone computer system, as shown in FIG. 1a, with software loaded into the system via a storage medium and device, such as a CD-ROM or disk drive.

Figure 2:
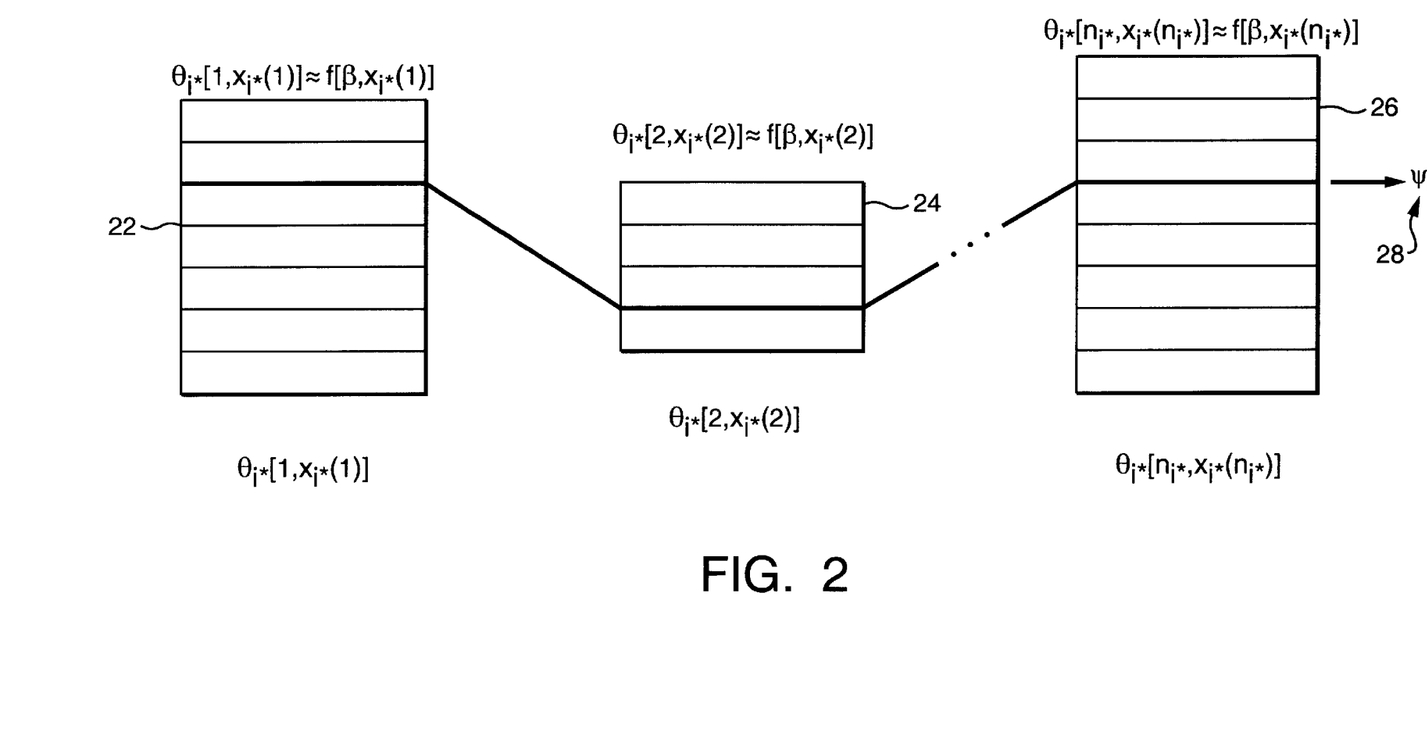
FIG. 2 is an example of an embodiment showing three components of an i* realization, and the mapping of performances to the overall performance.

FIG. 2 depicts a particular realization i* of the stochastic process that is a sequence of performances. Three components are shown as elements 22, 24, and 26, corresponding to the first, second, and final $n_{i^*}$th step. The performances, evaluated at each of the $n_{i^*}$ steps {$\theta_{i^*}[1, x_{i^*}(1)], \theta_{i^*}[2, x_{i^*}(2)], \ldots, \theta_{i^*}[n_{i^*}, x_{i^*}(n_{i^*})]$}, are mapped to the overall performance $\psi_{i^*}$ 28.

In one embodiment of the present invention, the stochastic process involves the performance of telephone operation. A realization of this stochastic process is then a particular telephone connection. Each connection is composed of a sequence of connections associated with the steps involved in establishing the telephone connection. Each component in this embodiment may include a cable and other electrical hardware. The performance of each cable component is a function of the characteristics of the cable.

Figure 3:
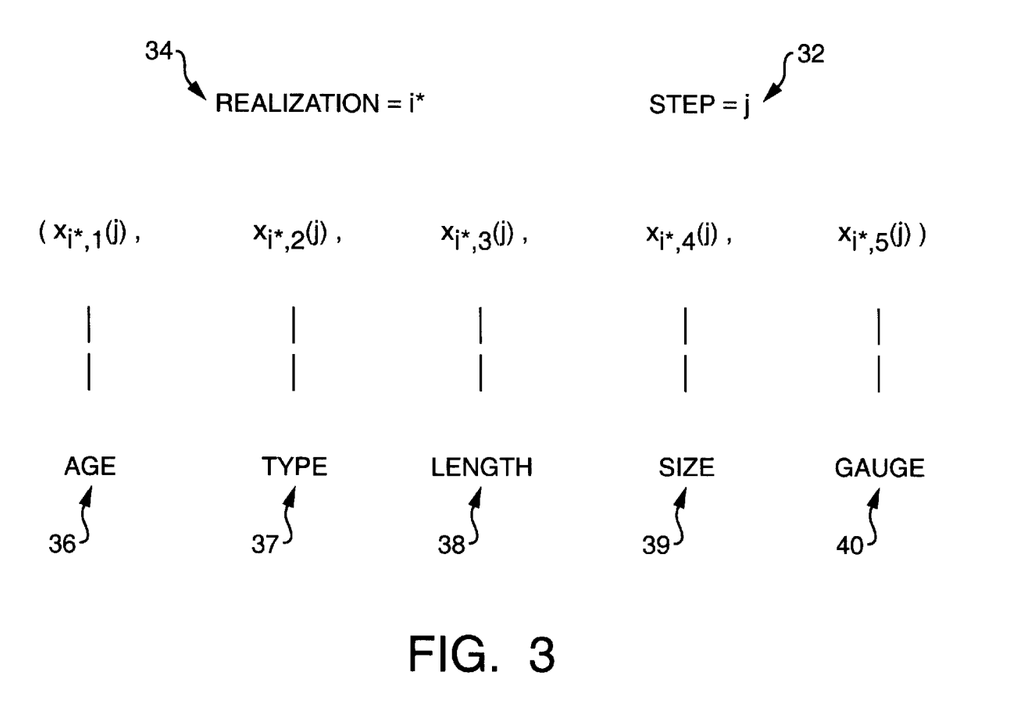
In FIG. 3 is an example of some characteristics of cable components in one embodiment of the present invention pertaining to telephone connections. The five characteristics shown are cable age, type, length, size, and gauge.

In FIG. 3 is shown some characteristics of cable components in one embodiment of the present invention pertaining to telephone connections. The particular realization shown is for the jth step 32 of the i* realization 34. Five types of characteristics are shown, although this number may vary in other embodiments. Accordingly the vector of characteristics $x_{i^*}$ (j) has five components. (The component of a vector should not be confused with the component of a connection; the former refers to each of the numbers in an ordered set defining a column or row vector, the latter is associated with each of the n; steps of connection i.) The five characteristics shown in FIG. 3 are cable age 36, type 37, length 38, size 39, and gauge 40.

Figure 4:
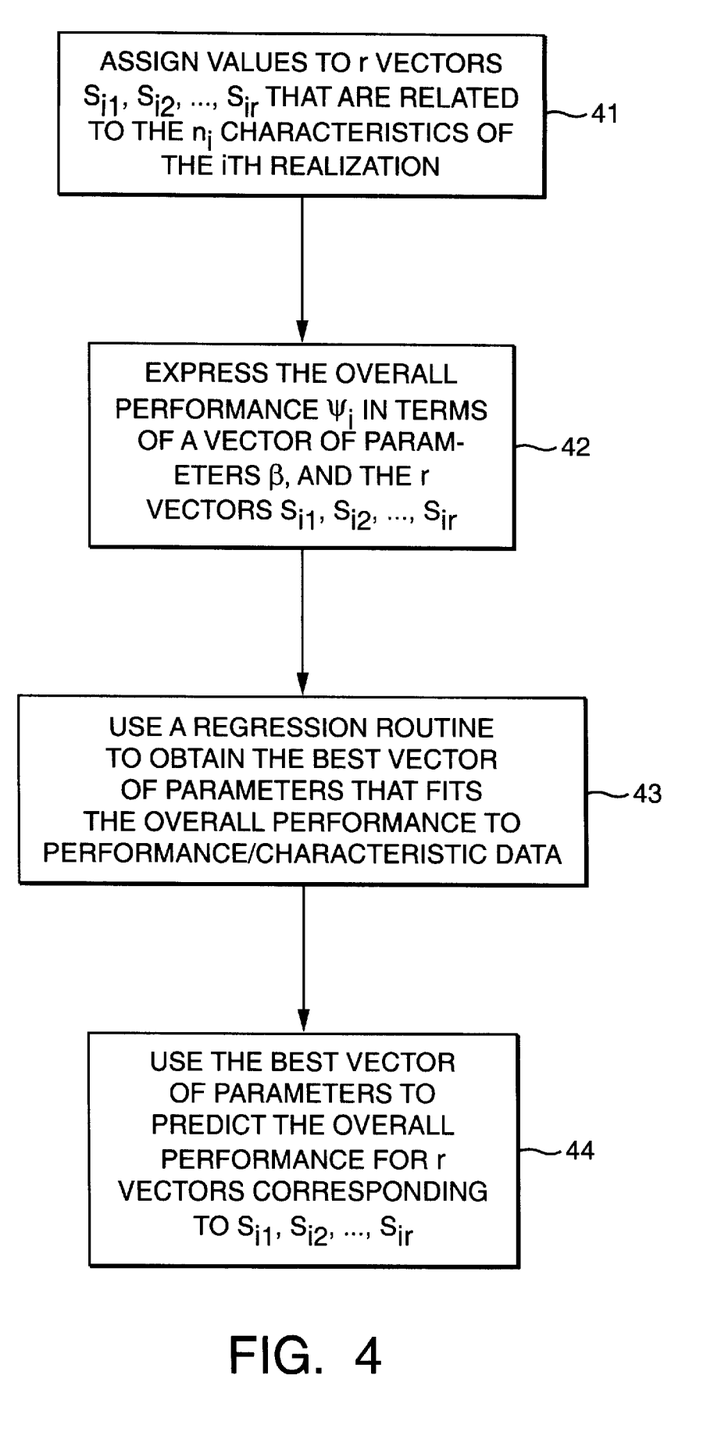
FIG. 4 is a flowchart of method steps of an embodiment of how fitting and predicting of the overall performance proceeds using performance/characteristics data.

FIG. 4 is a flowchart of an embodiment of the present invention indicating how fitting and predicting of the overall performance proceeds using performance/characteristics data. In the first stage 41, each of the r c-component vectors, $s_{i,1}, s_{i,2}, \ldots,$ and $s_{i,r}$, that depend on the $n_i$ characteristic vectors $x_i(1), x_i(2), \ldots,$ and $x_i(n_i)$, is assigned. In the second stage 42, the overall performance, $\psi_i$, is expressed in terms of a vector of parameters $\beta$ and the r vectors $s_{i,1}, s_{i,2}, \ldots,$ and $s_{i,r}$. In stage 43, a regression routine is used to obtain a best vector of parameters that fits the overall performance to performance/characteristic data. In the final stage 44, the best vector of parameters is used to predict the overall performance for r vectors corresponding to $s_{i,1}, s_{i,2}, \ldots,$ and $s_{i,r}$.

The implementation of this regression routine will now be outlined for a particular embodiment of the present invention. Equation (10) has the following form for a specific implementation in which the cable connection under examination is composed of components of three different types, and interest centers on the effects of the age of those types:

$$CabTrb1 = \exp(bCO\#*CO\#+bCTyp1*n\_CTyp1+ bageCTyp1*ageCTyp1+bCTyp2*n\_CTyp2+$$

$bageCTyp2*ageCTyp2+bCTyp3*n\_CTyp3+bageCtyp3*ageCTyp3)+\text{error}$ where:

CabTrb1=1(0) if the ith cable connection has (has not had) cable trouble

CO#=1(0) if ith cable connection emanates (does not emanate) from Central Office # n_CTyp1=number of cable components of type CTyp1 in cable i ageCTyp1=sum of ages of Ctyp1 components in cable connection i n_CTyp2=number of cable components of type CTyp2 in cable connection i ageCTyp2=sum of ages of Ctyp2 components in cable connection i n_CTyp3=number of cable components of type CTyp3 in cable connection i ageCTyp3=sum of ages of Ctyp3 components in cable connection i are characteristics of cable connection i. The nonlinear regression estimates the following free parameters:

bCO#
bCTyp1
bCTyp2
bCTyp3
bageCTyp1
bageCTyp2
bageCTyp3 which are interpreted in the usual regression sense, i.e., the incremental change in the term in parentheses on the right-hand side of the above equation for a one-unit change in each component's associated characteristic. For example, the parameter bageCTyp1 is the effect (measured as a multiplicative factor of exp(bageCTyp1) of an increase of one year of total age in the components of cable type Ctyp1 in each cable connection in the population under examination.

The term "error" is a term which allows for any discrepancies between the cable trouble which is actually observed (either a 0 or 1) and the function on the right-hand side of the equation (which is continuous). As is standard in regression problems, this term is not estimated for any individual cable connection, but is simply included in to balance the equation.

Figure 5:
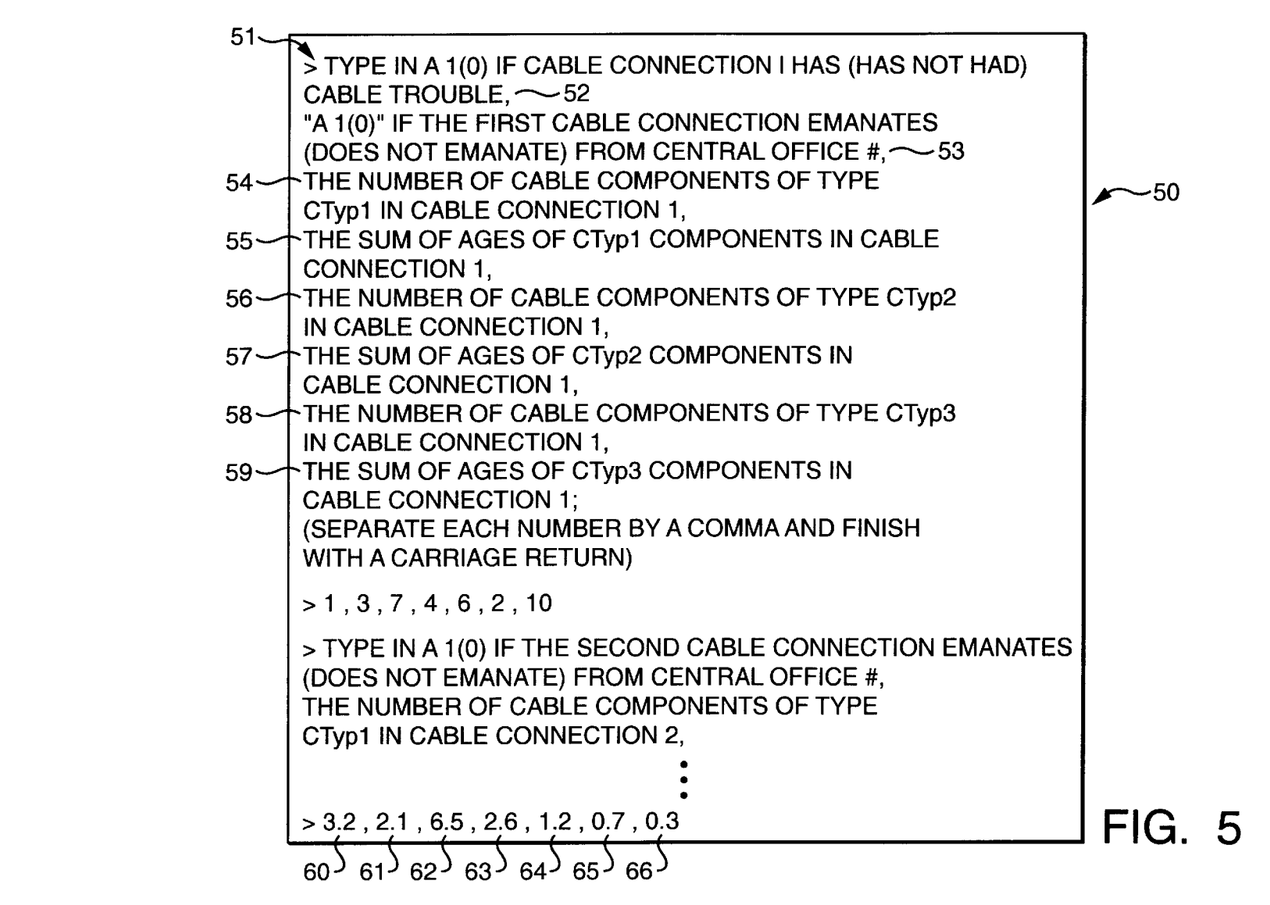
FIG. 5 is an example of computer prompts for data, sample input data, and the computer output.

FIG. 5 is an example of a computer screen 50 showing computer prompts for data, sample input data, and the computer output. The user is presented with a request 51. In this case, the user enters a 1(0) if cable connection 1 has (has not had) cable trouble 52, a 1(0) if the ith cable connection emanates (does not emanate) from Central Office # 53, the number of cable components of type CTyp1 in cable connection 1 54, the sum of ages of CTyp1 components in cable connection 1 55, the number of cable components of type CTyp2 in cable connection 1 56, the sum of ages of CTyp2 components in cable connection 1 57, the number of cable components of type CTyp3 in cable connection 1 58, and the sum of ages of Ctyp3 components in cable connection 1 59. The user hits the return key to indicate to the software that data have been selected for cable connection 1. The user is then prompted to enter similar data for cable connection 2 followed by hitting the return key. After the data for all cable connections have been entered, the computer outputs the best-fit parameters corresponding to bCO# 60, bCTyp1 61, bCTyp2 62, bCTyp3 63, bageCTyp1 64, bageCTyp2 65, and bageCTyp3 66.

Figure 6:
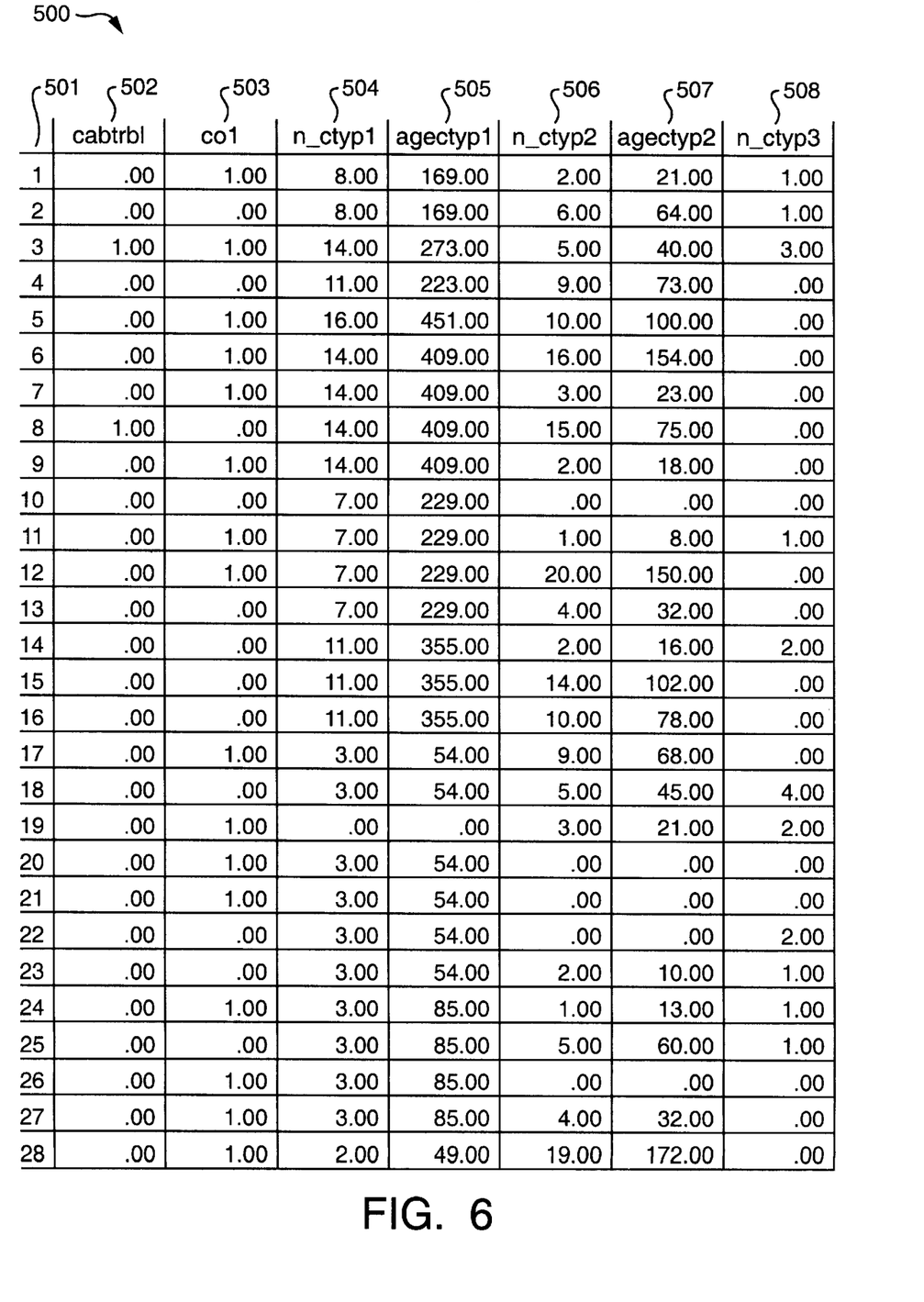
FIG. 6 is a representative input data file for the present invention.

Alternatively instead of inputting data at the keyboard, data can be accessed from a data file on, for example, a hard drive, or CD-ROM. Using data files instead of inputting data at the keyboard is convenient if large amounts of data is to be processed. FIG. 6 is a representative input data file 500 including characteristics of twenty-eight telephone connections. The first column 501 lists the realization number. The second column 502 contains entries of a 1(0) if the respective cable connection has (has not had) cable trouble. The third column 503 contains entries of a 1(0) if the respective cable connection emanates (does not emanate) from Central Office 1. The fourth column 504 contains entries corresponding to the number of cable components of type CTyp1 in the respective connection. The fifth column 505 contains entries corresponding to the sum of ages of CTyp1 components in the respective connection. The sixth column 506 contains entries corresponding to the number of cable components of type CTyp2 in the respective connection. The seventh column 507 contains entries corresponding to the sum of the ages of CTyp2 components in the respective connection. The eighth column 508 contains entries corresponding to the number of cable components of type CTyp3 in the respective cable connection. A final column (not shown) could contain entries corresponding to the sum of the ages of Ctyp3 in the respective cable connection.

The parameters for the model can be estimated by any one of several known regression algorithms. In one embodiment, a particular nonlinear least-squares routine known as the Levenburg-Marquardt Method is used. One convenient software package that makes this method available is provided by SPSS, Inc., 444 N. Michigan Ave., Chicago, Ill. The SPSS package allows the user to enter macro commands to invoke the least-squares fit. In one embodiment, the file containing the input field data is first opened and the following commands are issued:

```
MODEL PROGRAM BCO#=0 BCTyp1=0
  BAGECTyp1=0 BCTyp2=0 BAGECTyp2=0 BCTyp3=0
    BAGECTyp3=0 BGAUGE=0
BLGTH=0
COMPUTE PRED_=exp(bCO#*CO#+bcTyp1*n_Ctyp1+
bageCTyp1*ageCTyp1+
bCTyp2*n_Ctyp2+bageCTyp2*ageCTyp2+bCTyp3*n_
Ctype3+bageCTyp3*ageCTyp3)

NLR cabprob1
/OUTFILE=C:\TRIAL\TEM\SPSSFNLR.TMP'
/PRED PRED_
/CRITERIA SSCONVERGENCE 1E-8 PCON 1E-8

EXECUTE
```

The equations whose right-hand sides are zero represent parameter initializations. The equation corresponding to Eq. (10) appears as the fourth line that assigns PRED_. The fourth-last line directs the output to a particular file. The second-last line sets some error tolerances that dictate when the algorithm stops. This program executes a Levenberg-Marquardt fitting algorithm to estimate the parameters labeled in the COMPUTE line with a "B" as a first letter.

Although a Levenburg-Marquadt algorithm was used, it should be clear to someone of ordinary skill in the art that other regression or linear-square algorithms, whether or not these algorithms are used as part of a statistical package such as SPSS, may also be used in the present invention.

While the invention has been disclosed in connection with the preferred embodiments shown and described in detail, various modifications and improvements thereon will become readily apparent to those skilled in the art. Accordingly the spirit and scope of the present invention are to be limited only by the following claims.

What is claimed is:

1. A method executed in a computer system for diagnosing, and predicting trouble causes in a process involving realizations of performance of a telephone connection, wherein the ith realization has $n_i$ steps and the performance is a function of a c-component vector of characteristics, said performance and c-component vector having a value of $\theta_i[j, x_i(j)]$ and $x_i(j)$, respectively at the jth step of the ith realization, comprising a) expressing an overall performance, $\psi_i$, as a function, $\phi_i$, of the performance at each of the $n_i$ steps, $\psi_i = \phi_i\{\theta_i[1, x_i(1)], \theta_i[2, x_i(2)], \ldots, \theta_i[n_i, x_i(n_i)]\}$;

b) choosing a function, f, of a d-component vector of parameters, $\beta$, and the c-component vector of characteristics with which to approximate the performances, $\theta_i[j, x_i(j)] \approx f[\beta, x_i(j)]$, such that the overall performance, $\psi_i$, can be written as a function, $\gamma_i$, of the d-component vector of parameters and r c-component vectors, $s_{i,1}, s_{i,2}, \ldots$, and $s_{i,r}$, that depend on the $n_i$ characteristic vectors $x_i(1)$, $x_i(2), \ldots$, and $x_i(n_i)$, $$\psi_i = \phi_i\{f[\beta, x_i(1)], f[\beta, x_i(2)], \ldots, f[\beta, x_i(n_i)]\}$$

$$\equiv \gamma_i\{\beta, s_{i,1}[x_i(1), x_i(2), \ldots, x_i(n_i)],$$

$$s_{i,2}[x_i(1), x_i(2), \ldots, x_i(n_i)], \ldots,$$

$$s_{i,r}[x_i(1), x_i(2), \ldots, x_i(n_i)]\}$$

where $r < n_i$; and c) finding a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots$, and $s_{i,r}$.

2. A method executed in a computer system for diagnosing, and predicting trouble causes in a process as in claim 1, further comprising d) predicting the overall performance of a realization from r c-component vectors that correspond to $s_{i,1}, s_{i,2}, \ldots$, and $s_{i,r}$ by utilizing the best vector of parameters.

3. A method executed in a computer system for diagnosing, and predicting trouble causes in a process as in claim 1, wherein choosing a function, f, of a d-component vector of parameters, $\beta$, and the c-component vector of characteristics, includes choosing a function, f, of a c-component vector of parameters, $\beta$, and the c-component vector of characteristics.

4. A method executed in a computer system for diagnosing, and predicting trouble causes in a process as in claim 3, wherein expressing an overall performance, $\psi_i$, as a function, $\phi_i$, of the performance at each of the $n_i$ steps, $\psi_i = \phi_i\{\theta_i[1, x_i(1)], \theta_i[2, x_i(2)], \ldots, \theta_i[n_i, x_i(3)]\}$, includes expressing the overall performance, $\psi_i$, as $\psi_i = \theta_i[1, x_i(1)] \theta_i[2, x_i(2)] \ldots \theta_i[n_i, x_i(n_i)]$.

5. A method executed in a computer system for diagnosing, and predicting trouble causes in a process as in claim 4, wherein choosing a function, f, of a c-component vector of parameters, $\beta$, and the c-component vector of characteristics with which to approximate the performances, includes choosing the function $f = \exp[\beta \cdot x_i(j)]$, where $\beta \cdot x_i(j)$ denotes an inner product of $\beta$ and $x_i(j)$.

6. A method executed in a computer system for diagnosing, and predicting trouble causes in a process as in claim 5, wherein finding a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots$, and $s_{i,r}$ includes finding a best vector using a microprocessor.

7. A method executed in a computer system for diagnosing, and predicting trouble causes in a process as in claim 6, wherein finding a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots$, and $s_{i,r}$ includes finding a best vector of parameters by using a regression algorithm to design a figure-of-merit function that measures agreement between the function $\gamma_i(\beta, s_{i,1}, s_{i,2}, \ldots, s_{i,r})$ and the data points.

8. A method executed in a computer system for diagnosing, and predicting trouble causes in a process as in claim 7, wherein the regression algorithm employs a Levenberg-Marquardt method.

9. A method executed in a computer system for predicting trouble in a telephone connection comprising a) characterizing a jth component of a sequence of $n_i$ components of an ith telephone connection by a c-component vector of characteristics $x_i(j)$;

b) assigning a performance $\theta_i[j, x_i(j)]$, that depends on the vector of characteristics, to the jth component of the ith telephone connection;

c) approximating the performance as $\theta_i[j, x_i(j)] = \exp[\beta \cdot x_i(j)]$, where $\beta$ is a c-component vector of parameters and $\beta \cdot x_i(j)$ denotes an inner product of $\beta$ and $x_i(j)$;

d) defining an overall performance of the ith telephone connection as the product of the performances over the components of the ith realization, $$\psi_i = \prod_{j=1}^{ni} \theta_i[j, x_i(j)];$$

e) varying the vector of parameters $\beta$ to find a best vector of parameters to fit a curve $$\psi_i = \exp\left[\beta \cdot \sum_{j=1}^{ni} x_i(j)\right]$$

$$= \exp(\beta \cdot s_i),$$

where $s_i = x_i(1) + x_i(2) + \ldots + x_i(n_i)$, to data points corresponding to the overall performance versus $s_i$.

10. A method executed in a computer system for predicting trouble in a telephone connection as in claim 9, further comprising f) predicting the overall performance of a realization from a c-component vector that corresponds to $s_i$ by utilizing the best vector of parameters.

11. A system for diagnosing, and predicting trouble causes in a process involving realizations of performance of a telephone connection, wherein the ith realization has $n_i$ steps and the performance is a function of a c-component vector of characteristics, said performance and c-component vector having a value of $\theta_i[j, x_i(j)]$ and $x_i(j)$, respectively at the jth step of the ith realization, comprising a) a computer;

b) instructions for said computer to express an overall performance, $\psi_i$, as a function, $\phi_i$, of the performance at each of the $n_i$ steps, $\psi_i = \phi_i\{\theta_i[1, x_i(1)], \theta_i[2, x_i(2)], \ldots, \theta_i[n_i, x_i(n_i)]\}$;

c) instructions for said computer to choose a function, f, of a d-component vector of parameters, $\beta$, and the c-component vector of characteristics with which to approximate the performances, $\theta_i[j, x_i(j)] \approx f[\beta, x_i(j)]$, such that the overall performance, $\psi_i$, can be written as a function, $\gamma_i$, of the d-component vector of parameters and r c-component vectors, $s_{i,1}, s_{i,2}, \ldots$, and $s_{i,r}$, that depend on the $n_i$ characteristic vectors $x_i(1), x_i(2), \ldots$, and $x_i(n_i)$, $$\psi_i = \phi_i\{f[\beta, x_i(1)], f[\beta, x_i(2)], \ldots, f[\beta, x_i(n_i)]\}$$

$$\equiv \gamma_i\{\beta, s_{i,1}[x_i(1), x_i(2), \ldots, x_i(n_i)],$$

$$s_{i,2}[x_i(1), x_i(2), \ldots, x_i(n_i)], \ldots,$$

$$s_{i,r}[x_i(1), x_i(2), \ldots, x_i(n_i)]\}$$

where $r < n_i$; and d) instructions for said computer to find a best vector of parameters that results in a best fit of the function $\gamma_i(\beta, s_{i,1}, s_{i,2}, \ldots, s_{i,r})$ to data points corresponding to the overall performance as a function of the r c-component vectors, $s_{i,1}, s_{i,2}, \ldots$, and $s_{i,r}$.

12. A system for diagnosing, and predicting trouble causes in a process as in claim 11, wherein an overall performance of a process with given characteristics is forecast by using the function $\gamma_i(\beta, s_{i,1}, s_{i,2}, \ldots, s_{i,r})$ with the best vector of parameters.

13. A system for predicting trouble in a telephone connection, wherein a jth component of a sequence of $n_i$ components of an ith telephone connection is characterized by a c-component vector of characteristics $x_i(j)$, comprising a) a computer;

b) instructions to said computer to assign a performance $\theta_i[j, x_i(j)]$, that depends on the vector of characteristics, to the jth component of the ith telephone connection;

c) instructions to said computer to (i) approximate the performance as $\theta_i[j, x_i(j)] = \exp[\beta \cdot x_i(j)]$, where $\beta$ is a c-component vector of parameters and $\beta \cdot x_i(j)$ denotes an inner product of $\beta$ and $x_i(j)$, and (ii) define an overall performance of the ith telephone connection as the product of the performances over the components of the ith realization, $$\psi_i = \prod_{j=1}^{ni} \theta_i[j, x_i(j)]; \quad \text{and}$$

d) means for varying the vector of parameters $\beta$ to find a best vector of parameters to fit a curve $$\psi_i = \exp\left[\beta \cdot \sum_{j=1}^{ni} x_i(j)\right]$$

$$= \exp(\beta \cdot s_i),$$

where $s_i = x_i(1) + x_i(2) + \ldots + x_i(n_i)$, to data points corresponding to the overall performance versus $s_i$.

14. A system to diagnose trouble causes in telephone cable segments when trouble data are available only for entire cables comprising a) a computer;

b) means for approximating an overall performance of a telephone connection depending on n c-component vectors of characteristics so that said overall performance can be modeled by using a function with adjustable c-component vectors of parameters, said vectors of parameters being less in number than n; and c) means for varying the adjustable c-component vectors of parameters to find best-fit vectors of parameters to fit a curve to data points.

15. A system to diagnose trouble causes in telephone cable segments when trouble data are available only for entire cables as in claim 14, wherein means for varying the adjustable c-component vectors of parameters includes using a regression algorithm.

\* \* \* \* \*